United States Patent [19]

Haines

[11] Patent Number: 4,697,107

[45] Date of Patent: Sep. 29, 1987

[54] FOUR-STATE I/O CONTROL CIRCUIT

[75] Inventor: Ralph W. Haines, Sunnyvale, Calif.

[73] Assignee: National Semiconductor Corporation, Santa Clara, Calif.

[21] Appl. No.: 889,686

[22] Filed: Jul. 24, 1986

[51] Int. Cl.⁴ .......................................... H03K 17/693
[52] U.S. Cl. ..................... 307/474; 307/451; 307/475; 307/585; 307/247.1
[58] Field of Search ............... 307/443, 451, 445, 473, 307/474, 475, 247 R, 270, 579, 585; 364/716

[56] References Cited

U.S. PATENT DOCUMENTS

| | | | |
|---|---|---|---|
| 4,158,786 | 6/1979 | Hirasawa | 307/270 X |
| 4,217,502 | 8/1980 | Suzuki et al. | 307/473 |
| 4,242,738 | 12/1980 | Dingwall | 307/270 X |
| 4,281,259 | 7/1981 | Ozawa | 307/579 X |
| 4,309,701 | 1/1982 | Nishimura | 307/474 X |
| 4,408,135 | 10/1983 | Yuyama et al. | 307/474 |
| 4,499,388 | 2/1985 | Adam | 307/474 |
| 4,621,208 | 11/1986 | Tran | 307/585 X |

FOREIGN PATENT DOCUMENTS 41325 3/1985 Japan ................................. 307/473

Primary Examiner—John S. Heyman
Assistant Examiner—D. R. Hudspeth
Attorney, Agent, or Firm—Limbach, Limbach & Sutton

[57] ABSTRACT

An I/O control circuit is provided which is of the type that receives two inputs such that four sets of input conditions to the circuit are defined. A first set of input conditions establishes a low impedance path from the circuit output to the positive supply. A second set of input conditions establishes a low impedance path from the output to the negative supply, or ground. A third set of input conditions establishes a high impedance path from the output to both the positive and the negative supply. And, in accordance with the present invention, "pull-up" means is connected to the output such that the fourth set of input conditions establishes a path to the positive supply, the path having an impedance which is intermediate that of the low impedance and the high impedance. Alternatively, "pull-down down" means is connected to the output such that the fourth set of input conditions establishes an intermediate impedance path to the negative supply.

9 Claims, 3 Drawing Figures

FOUR-STATE I/O CONTROL CIRCUIT

BACKGROUND OF THE INVENTION

1. Field of the Invention

This invention relates to semiconductor integrated circuits and, particularly, to a microprocessor or microcontroller I/O control circuit which provides four output states corresponding to the four sets of input conditions established by the two inputs to the circuit.

2. Discussion of the Prior Art

FIG. 1 and its accompanying truth table illustrate a typical prior art "three-state" microprocessor I/O control circuit. I/O control circuits of this type are used to establish a communications interface between the internal processing and memory elements of a computer or control system on the one hand and external peripheral equipment, such as a display or a keyboard, on the other hand.

As shown in FIG. 1, two state devices, illustrated as a configuration latch and a data latch, are utilized to control the flow of information between the system's internal data bus and the "output" node of the I/O control circuit, which is the system's contact point with the external world. When both the configuration latch and the data latch are set to zero, the output node is in the high impedance state. The output is also in the high impedance state when the configuration latch is set to zero and the data latch is set to one. To provide a push-pull output, the configuration latch is set to one and the data latch is used to control the output. That is, when the configuration latch is set to one and the data latch is set to zero, the output node is at zero. Conversely, when the configuration latch is set to one and the data latch is also set to one, then the output node is at one.

The above-described I/O control circuit may, thus, be used both to write either high and low outputs from the processor to the external devices or, alternatively, in the high impedance state, to read in information or instructions from peripheral devices.

Circuits of this type find application in conjunction with memory devices where a number of memories are tied together or share a common I/O port. Three-state devices of this type are useful because they allow the user to program the memory while allowing the flexibility to configure the I/O output.

One problem associated with such three-state devices is that if the I/O port is not driven by the external device, then the state of the I/O port is indeterminate. For example, if the I/O port is used to read a switch or keyboard, then when the switch is open, the I/O port is not driven and its state is indeterminate. The conventional solution requires the user to include an additional pull-up resistor on each switch. This requires the use of more parts and increases cost.

A prior art solution ties the pull-up resistor to the I/O port. However, this prevents the I/O port from going to the true high impedance state.

SUMMARY OF THE INVENTION

An I/O control circuit is provided which is of the type that receives two inputs such that four sets of input conditions to the circuit are defined. A first set of input conditions establishes a low impedance path from the circuit output to the positive supply. A second set of input conditions establishes a low impedance path from the output to the negative supply, or ground. A third set of input conditions establishes a high impedance path from the output to both the positive and the negative supply. And, in accordance with the present invention, "pull-up" means is connected to the output such that the fourth set of input conditions establishes a path to the positive supply, the path having an impedance which is intermediate that of the low impedance and the high impedance. Alternatively, "pull-down" means is connected to the output such that the fourth set of input conditions establishes an intermediate impedance path to the negative supply.

DETAILED DESCRIPTION OF A PREFERRED EMBODIMENT

Figure 1:
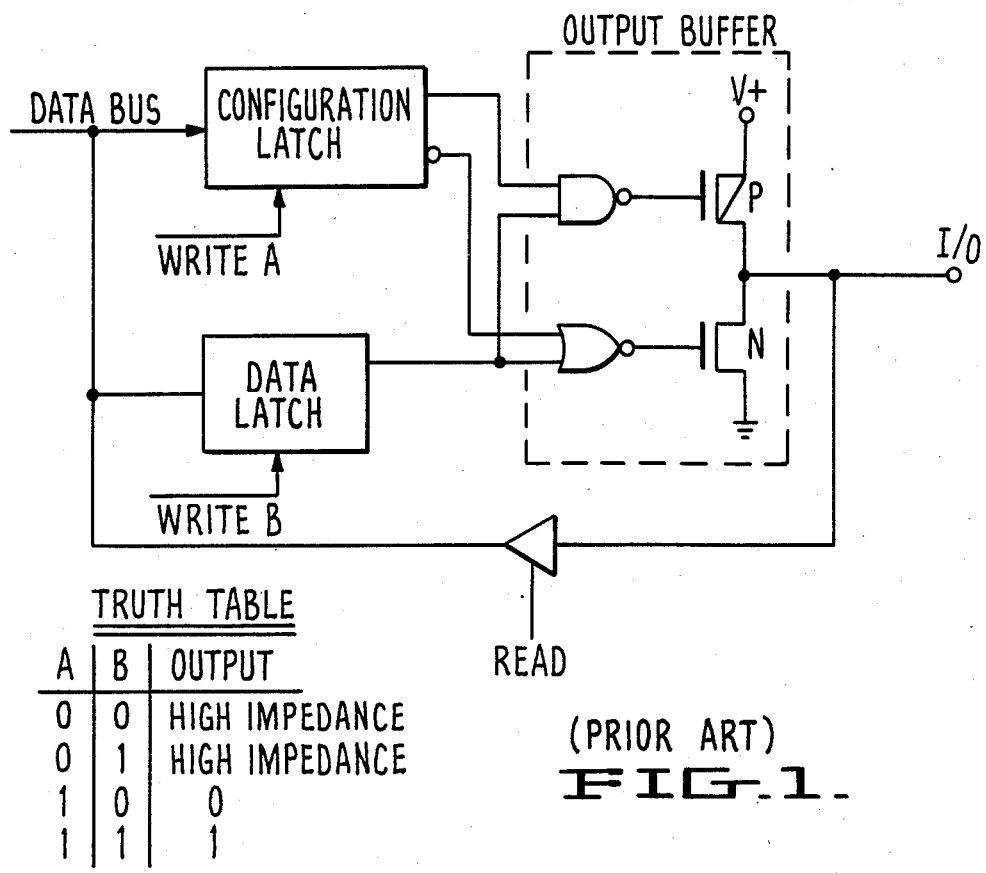
FIG. 1 is a schematic diagram illustrating a three-state microprocessor I/O control circuit typical of the prior art, together with an associated truth table.
Figure 2:
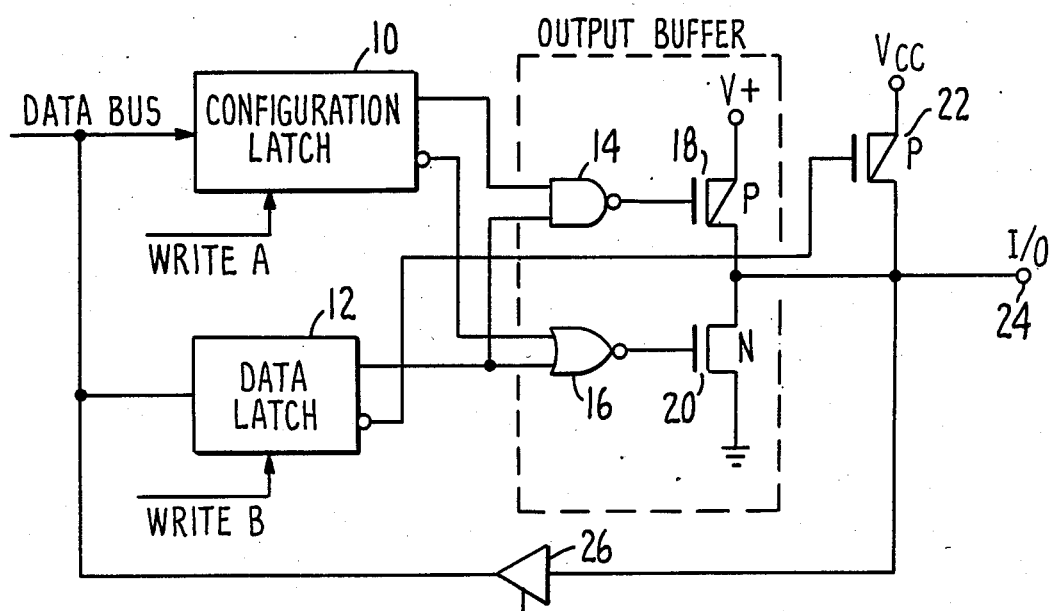
FIG. 2 is a schematic diagram illustrating a preferred embodiment of a four-state I/O control circuit in accordance with the present invention, together with an associated truth table.

A preferred embodiment of a four-state microprocessor I/O control circuit according to the present invention, together with its associated truth table, is shown in FIG. 2.

A configuration latch 10 is connected to receive a write signal A. The configuration latch 10 is loaded with the state of the data bus when write signal A high comes on. Configuration latch 10 generates two outputs. The logic state of the first output corresponds to the logic state of configuration latch 10. The logic state of the second output is the complement of the logic state of configuration latch 10.

A data latch 12 is connected to receive a write signal B. The data latch 12 is loaded with the state of the data bus when write signal B high come on. The data latch 12 also generates two outputs. The logic state of the first output of data latch 12 corresponds to the logic state of data latch 12. The logic state of the second output of data latch 12 is the complement of the logic state of data latch 12.

As shown in FIG. 2, the I/O circuit further includes a CMOS output stage consisting a p-channel device 18 and n-channel device 20. The drain of the p-channel device 18 is connected to the drain of the n-channel device 20. The source of device 18 is connected to a positive supply voltage V+. The source of device 20 is connected to ground.

A NAND gate 14, the output of which is connected to the gate of p-channel device 18, receives as dual inputs the first output of the configuration latch 10 and the first output of the data latch 12.

A NOR gate 16, the output of which is connected to the gate of n-channel device 20, receives as dual inputs the second output of configuration latch 10 and the first output of data latch 12.

The output 24 of the circuit is provided between the drain of transistor 18 and the drain of device 20. In accordance with the embodiment present invention shown in FIG. 2, a pull-up transistor 22 is connected to the input/output node 24. The drain of the pull-up transistor 22 is connected to the supply voltage V+. The gate of pull-up transistor 22 is connected to the second output of data latch 12. The source of the pull-up transistor 22 is connected to the output node 24. The input buffer 26 provides a means for reading the state of the I/O node 24 to the data bus.

Transistor 18 is built with a large device size to give a low impedance output drive. When device 18 is on, it provides a normal buffered one output. Transistor 20 is built with a large device size to give a low impedance buffered output to ground. Transistor 22 is built with a smaller device size to have an increased impedance. When device 22 is on, the output 24 is drive to a "weak" or resistive one.

Referring to the truth table associated with FIG. 2, a high impedance state is created at node 24 by setting both the configuration latch 10 and the data latch 12 to 0 (transistors 18, 20 and 22 are all off).

In accordance with the present invention, for "read" inputs to the I/O circuit which require pull-up, e.g., for read inputs from switches or keyboards, the open end I/O node 24 reads a "weak" 1 or resistive 1, the switch or key driving the output to ground. This state results from setting the configuration latch 10 to 0 and the data latch 12 to 1 (transistor 22 is on).

To obtain a push-pull output, the configuration latch 10 is set to 1 and the data latch 12 is used to control the output 24. That is, with the configuration latch 10 set to 1, when data latch 12 is set to 0, the output is 0 (transistor 20 is on). Conversely, when data latch 12 is set to 1, the output 24 is 1 (transistors 18 and 22 are on).

For an open-drain output, the data latch 12 is set to 0 and the configuration latch 10 is used to control the output. That is, with the data latch set to 0, when the configuration latch is set to 0, the output is open. When the configuration latch is set to 1, the output is 0 (driven to ground).

For a wired-OR output, i.e., an output with a load device, the configuration latch 10 is set to 0 and the data latch 12 is set to 1 to obtain an inactive output with pull-up. With the configuration latch 10 set at 1 and the data latch 12 set at 0, the output is 0 (driven to ground).

The embodiment of the invention illustrated in FIG. 2 provides a resistive "one" output. A resistive "zero" output is provided by an alternative embodiment of the invention, shown in FIG. 3 together with its associated truth table.

Figure 3:
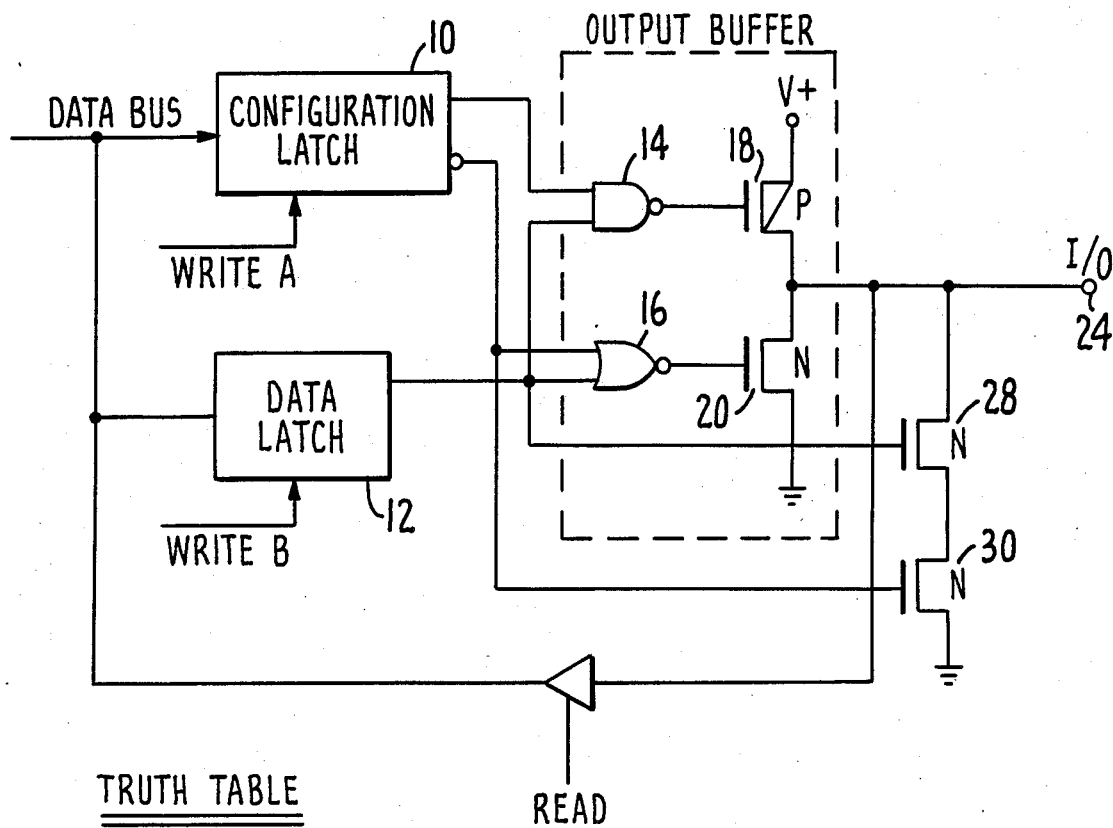
FIG. 3 is a schematic diagram illustrating an alternative embodiment of a four-state I/O control circuit in accordance with the present invention, together with an associated truth table.

In the embodiment shown in FIG. 3, the true and complement outputs of configuration latch are provided as inputs to NAND gate 14 and NOR gate 16, respectively. The data latch 12, however, has only one output which corresponds to the logic state of data latch 12. A second input to NAND gate 14 is provided by the output of data latch 12. A second input to NOR gate 16 is provided by the complementary output of configuration latch 10. The outputs of the NAND gate 14 and NOR gate 16 are connected to the gates of p-channel device 18 and n-channel device 20, respectively, which are configured as in the FIG. 2 embodiment.

This embodiment differs from the FIG. 2 embodiment in that the p-channel pull-up transistor 22 shown in FIG. 2 is deleted and replaced by two n-channel devices 28 and 30. The source of transistor 28 is connected to the output 24. The drain of transistor 28 is connected to the source of transistor 30. The drain of transistor 30 is connected to ground. The gate of transistor 30 is connected to the complementary output of the configuration latch 10. The gate of transistor 28 is connected to the output of the data latch 12. Output feedback is provided to the data bus via buffer 26.

Referring to the truth table provided with FIG. 3, it can be seen that when the configuration latch of the FIG. 3 embodiment is set to zero and the data latch 12 is set to one, a "weak" or resistive zero state results at the output 24 (transistors 28 and 30 are on). For the three other sets of input conditions, the truth tables for the FIG. 3 and FIG. 2 embodiments are the same.

It should be understood that various alternatives to the embodiment illustrated herein may be employed in practicing the present invention. It is intended that the following claims define the invention, and that the structure and methods within the scope of these claims and their equivalents be covered thereby.

What is claimed is:

1. A four-state I/O control circuit comprising:

a configuration latch connected to a data bus such that the configuration latch is loaded with the state of the data bus when a first signal is applied to the configuration latch, the configuration latch having a first output and a second output, the logic state of the first output of the configuration latch corresponding to the logic state of the configuration latch, the logic state of the second output of the configuration latch corresponding to the complement of the logic state of the configuration latch;

a data latch connected to the data bus such that the data latch is loaded with the state of the data bus when a second signal is applied to the data latch, the data latch having a first output and a second output, the logic state of the first output of the data latch corresponding to the logic state of the data latch, the logic state of the second output of the data latch corresponding to the complement of the logic state of the data latch;

first and second transistors of the type having source, drain and gate electrodes, wherein the drain of the first transistor is connected to the drain of the second transistor, the source of the first transistor is connected to a supply voltage, and the source of the second transistor is connected to ground;

a NAND gate, the output of which is connected to the gate of the first transistor, the first output of the configuration latch and the first output of the data latch being provided as inputs to the NAND gate;

a NOR gate, the output of which is connected to the gate of the second transistor, the second output of the configuration latch and the first output of the data latch being provided as inputs to the NOR gate;

an output node connected between the drain of the first transistor and the drain of the second transistor; and a pull-up transistor of the type having drain, source and gate electrodes, having its source connected to the supply voltage, its gate connected to the second output of the data latch, and its drain connected to the output node such that (i) when the state of the configuration latch is high and the state of the data latch is high, a low impedance path is established between the output node and the supply voltage;

(ii) when the state of the configuration latch is high and the state of the data latch is low, a low impedance path is established between the output node and ground;

(iii) when the state of the configuration latch is low and the state of the data latch is low, a high impedance path is established between the output node and both the supply voltage and ground; and (iv) when the state of the configuration latch is low and the state of data latch is high, a path having an impedance intermediate that of the low impedance path and the high impedance path is established between the output node and the supply voltage.

2. A four-state I/O control circuit as in claim 1 wherein the pull-up transistor is a p-channel device.

3. A four-state I/O control circuit comprising:
a configuration latch connected to a data bus such that the configuration latch is loaded with the state of the data bus when a first write signal is applied to the configuration latch, the configuration latch having a first output and a second output, the logic state of the first output of the configuration batch corresponding to the logic state of the configuration latch, the logic state of the second output of the configuration latch corresponding to the complement of the logic state of the configuration latch;

a data latch connected to the data bus such that the data latch is loaded with the state of the data bus when a second write signal is applied to the data latch, the data latch having a first output the logic state of which corresponds to the logic state of the data latch;

first and second transistors of the type having source, drain and gate electrodes, wherein the drain of the first transistor is connected to the drain of the second transistor, the source of the first transistor is connected to a supply voltage, and the source of the second transistor is connected to ground;

a NAND gate, the output of which is connected to the gate of the first transistor, the first output of the configuration latch and the first output of the data latch being provided as inputs to the NAND gate;

a NOR gate, the output of which is connected to the gate of the second transistor, the second output of the configuration latch and the first output of the data latch being provided as inputs to the NOR gate;

an output node connected between the drain of the first transistor and the drain of the second transistor; and pull-down means connected to the output node, the pull-down means comprising third and fourth transistors of the type having source, drain and gate electrodes, the drain of the third transistor being connected to the output node, the source of the third transistor being connected to the drain of the fourth transistor, the source of the fourth transistor being connected to ground, the gate of the third transistor being connected to the second output of the configuration latch, and the gate of the fourth transistor being connected to the first output of the data latch such that (i) when the state of the configuration latch is high and the state of the data latch is high, a low impedance path is established between the output node and the supply voltage;

(ii) when the state of the configuration latch is high and the state of the data latch is low, a low impedance path is established between the output node and ground;

(iii) when the state of the configuration latch is low and the state of the data latch is low, a high impedance path is established between the output node and both the supply voltage and ground; and (iv) when the state of the configuration latch is low and the state of the data latch is high, a path having an impedance intermediate that of the low impedance path and the high impedance path is established between the output node and ground.

4. A four-state I/O control circuit as in claim 3 wherein both the third transistor and the fourth transistor are n-channel devices.

5. In an I/O control circuit of the type that receives only two inputs such that four sets of input conditions to the circuit are defined and wherein the circuit includes means responsive to a first set of input conditions to establish a low impedance path from the circuit output to a first supply voltage, means responsive to a second set of input conditions to establish a low impedance path from the output to a second supply voltage which is more negative than the first supply voltage and means responsive to a third set of input conditions to establish a high impedance path from the output to both the first supply voltage and the second supply voltage, the improvement comprising pull-up means connected to the output such that the fourth set of input conditions establishes a path from the output to the first supply voltage, the path having an impedance intermediate that of the low impedance path and the high impedance path.

6. In an I/O control circuit of the type that receives only two inputs such that fours sets of input conditions to the circuit are defined and wherein the circuit includes means responsive to a first set of input conditions to establish a low impedance path from the circuit output to a first supply voltage, means responsive to a second set of input conditions to establish a low impedance path from the output to a second supply voltage which is more negative than the first supply voltage and means responsive to a third set of input conditions to establish a high impedance path from the output to both the first supply voltage and the second supply voltage, the improvement comprising pull-down means connected to the output such that the fourth set of input conditions establishes a path from the output to the second supply voltage, the path having an impedance intermediate that of the low impedance path and the high impedance path.

7. A method of controlling the logic state of the output of an I/O control circuit of the type that receives two inputs such that four sets of input conditions to the circuit are defined, the method comprising
establishing a low impedance path from the output to a first voltage in response to a first set of input conditions;
establishing a low impedance path from the output to a second voltage in response to a second set of input conditions;
establishing a high impedance path from the output to both the first voltage and the second voltage in response to a third set of input conditions; and
in response to the fourth set of input conditions, establishing a path between the output and the first voltage having an impedance intermediate that of the high impedance and the low impedance.

8. A method as in claim 7 wherein the first voltage is a positive supply voltage.

9. A method as in claim 8 wherein the second voltage is ground.

* * * * *